United States Patent
Cho et al.

(10) Patent No.: US 9,711,578 B2
(45) Date of Patent: Jul. 18, 2017

(54) THIN FILM TRANSISTOR ARRAY PANEL AND ORGANIC LIGHT-EMITTING DISPLAY APPARATUS INCLUDING THE SAME

(71) Applicant: Samsung Display Co., Ltd., Yongin, Gyeonggi-Do (KR)

(72) Inventors: Seunghwan Cho, Yongin (KR); Dohyun Kwon, Yongin (KR); Donghwan Shim, Yongin (KR); Suyeon Sim, Yongin (KR); Minjung Lee, Yongin (KR); Sungeun Lee, Yongin (KR); Iljeong Lee, Yongin (KR); Jungkyu Lee, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 42 days.

(21) Appl. No.: 14/713,933

(22) Filed: May 15, 2015

(65) Prior Publication Data
US 2016/0111482 A1   Apr. 21, 2016

(30) Foreign Application Priority Data

Oct. 16, 2014 (KR) ........................ 10-2014-0140173

(51) Int. Cl.
*H01L 27/32* (2006.01)
*H01L 27/12* (2006.01)

(52) U.S. Cl.
CPC ...... *H01L 27/3258* (2013.01); *H01L 27/1248* (2013.01); *H01L 27/1255* (2013.01); *H01L 27/3265* (2013.01); *H01L 2227/323* (2013.01)

(58) Field of Classification Search
CPC ............ H01L 27/3265; H01L 27/1255; H01L 27/1248; H01L 27/3258; H01L 2227/323
See application file for complete search history.

(56) References Cited

U.S. PATENT DOCUMENTS

| | | |
|---|---|---|
| 2007/0052352 A1 | 3/2007 | Im et al. |
| 2010/0163881 A1 | 7/2010 | Kang et al. |
| | (Continued) | |

FOREIGN PATENT DOCUMENTS

| | | |
|---|---|---|
| KR | 10-0659765 B1 | 12/2006 |
| KR | 10-2009-0120697 A | 11/2009 |
| | (Continued) | |

*Primary Examiner* — Michael Jung
*Assistant Examiner* — Mikka Liu
(74) *Attorney, Agent, or Firm* — Knobbe Martens Olson & Bear LLP (57) ABSTRACT

A thin film transistor (TFT) circuit panel comprises a substrate and first and second patterned multi-layer structures formed over the substrate. The first patterned multi-layer structure is to provide a driving TFT and a storage capacitor, and comprises: a semiconductor layer, a first electrode over the semiconductor layer, a second electrode disposed over the first electrode and insulated from the first electrode, a storage insulating layer disposed between the first electrode and the second electrode, and a driving gate insulating layer disposed between the semiconductor layer and the first electrode. The second patterned multi-layer structure is spaced from the first multi-layer structure, and comprises: a lower patterned insulating layer, a patterned conductive layer and a top patterned insulating layer. An organic insulating material is filled between the first and second patterned multi-layer structures.

19 Claims, 6 Drawing Sheets

(56) References Cited

U.S. PATENT DOCUMENTS

| | | | | |
|---|---|---|---|---|
| 2011/0297941 A1* | 12/2011 | Zhan | .................. | H01L 28/87 |
| | | | | 257/59 |
| 2011/0297951 A1 | 12/2011 | Shin et al. | | |
| 2014/0061615 A1 | 3/2014 | Zhang | | |
| 2015/0014663 A1* | 1/2015 | Kwak | .............. | H01L 51/5253 |
| | | | | 257/40 |
| 2015/0243722 A1* | 8/2015 | Kwon | .............. | H01L 27/3262 |
| | | | | 257/40 |

FOREIGN PATENT DOCUMENTS

| | | | |
|---|---|---|---|
| KR | 10-2010-0076600 A | | 7/2010 |
| KR | 10-2011-0133243 A | | 12/2011 |
| KR | 10-2014-0041403 A | | 4/2014 |

* cited by examiner

THIN FILM TRANSISTOR ARRAY PANEL AND ORGANIC LIGHT-EMITTING DISPLAY APPARATUS INCLUDING THE SAME

RELATED APPLICATION

This application claims the benefit of Korean Patent Application No. 10-2014-0140173, filed on Oct. 16, 2014, in the Korean Intellectual Property Office, the disclosure of which is incorporated herein in its entirety by reference.

BACKGROUND

1. Field

One or more embodiments relate to thin film transistor (TFT) array panels and organic light-emitting display apparatuses including the same.

2. Description of the Related Art

In general, an organic light-emitting display apparatus is a self-luminous display apparatus that includes a plurality of organic light-emitting devices each including a hole injection electrode, an electron injection electrode, and an organic emission layer formed therebetween. Excitons are generated when holes injected from the hole injection electrode and electrons injected from the electron injection electrode are combined in the organic emission layer, and light is generated when the excitons fall from an excited state to a ground state.

Since the organic light-emitting display apparatus is a self-luminous display apparatus, a separate light source is unnecessary. Therefore, the organic light-emitting display apparatus may be driven at a low voltage and be manufactured with a light weight and a slim profile. In addition, the organic light-emitting display apparatus has high-grade characteristics, such as wide viewing angles, high contrast, and fast response times. Therefore, the organic light-emitting display apparatus is considered as a next-generation display apparatus.

SUMMARY

One or more embodiments include thin film transistor (TFT) array panels and organic light-emitting display apparatuses including the same.

Additional aspects will be set forth in part in the description which follows and, in part, will be apparent from the description, or may be learned by practice of the presented embodiments.

One aspect of the invention provides a thin film transistor (TFT) circuit panel device comprising: a substrate comprising a major surface; a first multi-layer structure disposed over the substrate for providing a driving TFT and a storage capacitor, the first multi-layer structure comprising: a semiconductor layer, a first electrode over the semiconductor layer, a second electrode disposed over the first electrode and insulated from the first electrode, a storage insulating layer disposed between the first electrode and the second electrode, and a driving gate insulating layer disposed between the semiconductor layer and the first electrode to insulate the first electrode from the semiconductor layer, wherein the semiconductor layer, the driving gate insulating layer and the first electrode provide the driving TFT, wherein the first electrode, the storage insulating layer and the second electrode provide the storage capacitor; and a second multi-layer structure disposed over the substrate and spaced from the first multi-layer structure when viewed in a viewing direction perpendicular to the major surface, the second multi-layer structure comprising: a lower patterned insulating layer disposed over the substrate and formed of the same material as the driving gate insulating layer; a patterned conductive layer disposed over the lower patterned insulating layer and formed of the same material as the first electrode; and a top patterned insulating layer disposed over the patterned conductive layer and formed of the same material as the storage insulating layer, wherein the lower patterned insulating layer, the patterned conductive layer, and the top patterned insulating layer have the same horizontal length in a section taken perpendicular to the major surface.

The foregoing device may further comprise an interlayer insulating layer covering the first and second multi-layer structures, wherein the interlayer insulating layer is formed of an organic material. In the foregoing device, the interlayer insulating layer may be formed over the entire major surface of the substrate, and comprises a portion disposed between the first electrode and the patterned conductive layer in the section. The storage insulating layer and the top patterned insulation layer may be formed of an inorganic material. The driving gate insulating layer and the lower patterned insulating layer may be formed of an inorganic material. The interlayer insulating layer may define a recess and a hole that exposes a portion of the storage insulating layer. The second electrode may be disposed in the recess and contact the interlayer insulating layer exposed through the hole.

Another aspect of the invention provides an organic light-emitting display apparatus comprising: the foregoing TFT circuit panel device; and an array of organic light-emitting elements disposed over the TFT circuit panel device, wherein the TFT circuit panel device comprises a plurality of additional first multi-layer structures, wherein the first multi-layer structure and the plurality of additional first multi-layer structures in combination provides an array of TFT circuits, each of which is connected to one of the organic light-emitting elements.

Still another aspect of the invention provides a thin film transistor (TFT) circuit panel device comprising: a substrate comprising a major surface; a driving TFT disposed over the substrate; a storage capacitor comprising a first electrode integrated with a driving gate electrode of the driving TFT into a single electrode, a second electrode disposed over the first electrode and insulated from the first electrode, and a storage insulating layer formed between the first electrode and the second electrode; a driving gate insulating layer disposed between the substrate and the driving gate electrode; a lower patterned insulating layer disposed over the substrate and formed of the same material as the driving gate insulating layer; a patterned electrode disposed over the lower patterned insulating layer and formed of the same material as the driving gate electrode; a top patterned insulating layer disposed over the patterned electrode and formed of the same material as the storage insulating layer; and an interlayer insulating layer formed to cover the storage capacitor and the top patterned insulating layer, wherein the lower patterned insulating layer, the patterned electrode, and the top patterned insulating layer have the same horizontal length in a section taken perpendicular to the major surface to form a patterned multi-layer structure spaced from the driving TFT when viewed in a viewing direction perpendicular to the major surface, wherein the interlayer insulating layer is formed of an organic material.

In the foregoing device, the interlayer insulating layer may be formed over the entire major surface of the substrate to fill a space between the substrate and a layer in which a source electrode and a drain electrode of the driving TFT are formed. The foregoing device may further comprise a switching TFT disposed over the substrate and spaced from the driving TFT when viewed in the viewing direction, wherein the interlayer insulating layer comprises a portion located between lines of the switching TFT and the driving TFT in the sectional view. The foregoing device may further comprise a switching TFT disposed over the substrate and spaced from the driving TFT when viewed in the viewing direction, wherein the interlayer insulating layer comprises a portion located between an active layer of the driving TFT and an active layer of the switching TFT. The storage insulating layer and the top patterned insulating layer may be formed of an inorganic material. The interlayer insulating layer may comprise a portion located between the storage insulating layer and the top patterned insulating layer. The driving gate insulating layer and the lower patterned insulating layer may be formed of an inorganic material. The interlayer insulating layer may comprise a portion located between the driving gate insulating layer and the lower patterned insulating layer. The driving TFT and the storage capacitor may be disposed to overlap each other at least partially when viewed in the viewing direction.

A further aspect of the invention provides an organic light-emitting display apparatus comprising: a substrate comprising a major surface; and a plurality of pixels disposed over the substrate, each of the plurality of pixels comprising: a driving thin film transistor (TFT) and a gate line disposed over the substrate; a storage capacitor comprising a first electrode integrated with a driving gate electrode of the driving TFT into a single electrode, a second electrode disposed over the first electrode and insulated from the first electrode, and a storage insulating layer formed between the first electrode and the second electrode; a driving gate insulating layer disposed between the substrate and the driving gate electrode; a lower patterned insulating layer disposed over the substrate and formed of the same material as the driving gate insulating layer; a patterned electrode disposed over the lower patterned insulating layer and formed of the same material as the driving gate electrode; and a top patterned insulating layer disposed over the patterned electrode and formed of the same material as the storage insulating layer, wherein the lower patterned insulating layer, the patterned electrode, and the top patterned insulating layer have the same horizontal length in a section taken perpendicular to the major surface to form a patterned multi-layer structure spaced from the driving TFT when viewed in a viewing direction perpendicular to the major surface.

The foregoing apparatus may further comprise an interlayer insulating layer covering the patterned multi-layer structure and the storage capacitor, wherein the interlayer insulating layer is formed of an organic material. In the foregoing apparatus, the interlayer insulating layer may be formed over the entire major surface of the substrate to fill a space between the substrate and a layer in which a source electrode and a drain electrode of the driving TFT are formed.

According to one or more embodiments, a TFT array substrate includes: a driving TFT disposed on a substrate; a storage capacitor including a first electrode connected to a driving gate electrode of the driving TFT, a second electrode disposed on the first electrode and insulated from the first electrode, and a storage insulating layer formed between the first electrode and the second electrode; a driving gate insulating layer disposed between the substrate and the driving gate electrode to insulating the driving gate electrode; a pattern insulating layer disposed on the substrate and formed in the same layer as the driving gate insulating layer; a pattern electrode disposed on a first line insulating layer and formed in the same layer as the driving gate electrode; and a top layer disposed on a first line and formed in the same layer as the storage insulating layer, wherein the first line insulating layer, the first line, and the top layer are batch-patterned to the same horizontal length to form a pattern.

The TFT array substrate may further include an interlayer insulating layer covering the pattern and the storage capacitor.

The interlayer insulating layer may be formed on an entire surface of the substrate to fill a space between the substrate and a layer in which a source electrode and a drain electrode of the driving TFT are formed.

The storage insulating layer and the top layer may be formed of an inorganic material.

The driving gate insulating layer and the pattern insulating layer may be formed of an inorganic material.

The interlayer insulating layer may include an opening that exposes a portion of the storage insulating layer.

The second electrode may be disposed in the opening.

According to one or more embodiments, a TFT array substrate includes: a driving TFT disposed on a substrate; a storage capacitor including a first electrode connected to a driving gate electrode of the driving TFT, a second electrode disposed on the first electrode and insulated from the first electrode, and a storage insulating layer formed between the first electrode and the second electrode; a driving gate insulating layer disposed between the substrate and the driving gate electrode to insulating the driving gate electrode; a pattern insulating layer disposed on the substrate and formed in the same layer as the driving gate insulating layer; a pattern electrode disposed on a first line insulating layer and formed in the same layer as the driving gate electrode; a top layer disposed on a first line and formed in the same layer as the storage insulating layer; and an interlayer insulating layer formed to cover the storage capacitor and the top layer; wherein the first line insulating layer, the first line, and the top layer are batch-patterned to the same horizontal length to form a pattern, and the interlayer insulating layer is formed of an organic material.

The interlayer insulating layer may be formed on an entire surface of the substrate to fill a space between the substrate and a layer in which a source electrode and a drain electrode of the driving TFT are formed.

The TFT array substrate may further include a switching TFT disposed on the substrate, wherein a space between lines of the switching TFT and the driving TFT may be formed of the interlayer insulating layer.

The TFT array substrate may further include a switching TFT disposed on the substrate, wherein a space between an active layer of the driving TFT and an active layer of the switching TFT may be formed of the interlayer insulating layer.

The storage insulating layer and the top layer may be formed of an inorganic material.

A space between the storage insulating layer and the top layer may be formed of the interlayer insulating layer.

The driving gate insulating layer and the pattern insulating layer may be formed of an inorganic material.

A space between the driving gate insulating layer and the pattern insulating layer may be formed of the interlayer insulating layer.

The driving TFT and the storage capacitor may be disposed to overlap each other at least partially.

According to one or more embodiments, an organic light-emitting display apparatus includes: a display region including a plurality of pixels; and a non-display region disposed around the display region, the plurality of pixels each including: a driving TFT and a gate line disposed on a substrate; a storage capacitor including a first electrode connected to a driving gate electrode of the driving TFT, a second electrode disposed on the first electrode and insulated from the first electrode, and a storage insulating layer formed between the first electrode and the second electrode; a driving gate insulating layer disposed between the substrate and the driving gate electrode to insulating the driving gate electrode; a pattern insulating layer disposed on the substrate and formed in the same layer as the driving gate insulating layer; a pattern electrode disposed on a first line insulating layer and formed in the same layer as the driving gate electrode; and a top layer disposed on a first line and formed in the same layer as the storage insulating layer, wherein the first line insulating layer, the first line, and the top layer are batch-patterned to the same horizontal length to form a pattern.

The organic light-emitting display apparatus may further include an interlayer insulating layer covering the pattern and the storage capacitor, wherein the interlayer insulating layer may be formed of an organic material.

The interlayer insulating layer may be formed on an entire surface of the substrate to fill a space between the substrate and a layer in which a source electrode and a drain electrode of the driving TFT are formed.

BRIEF DESCRIPTION OF THE DRAWINGS

These and/or other aspects will become apparent and more readily appreciated from the following description of embodiments, taken in conjunction with the accompanying drawings in which.

DETAILED DESCRIPTION

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

The inventive concept may include various embodiments and modifications, and embodiments are illustrated in the drawings and will be described below in detail. However, it will be understood that the inventive concept is not limited to the embodiments and includes all modifications, equivalents and substitutions falling within the spirit and scope of the inventive concept. Like reference numerals or symbols denote like elements throughout the specification and drawings.

Although terms such as "first" and "second" may be used herein to describe various elements or components, these elements or components should not be limited by these terms. These terms are only used to distinguish one element or component from another element or component.

The terms used herein are for the purpose of describing embodiments only and are not intended to limit the inventive concept. It will be understood that terms such as "comprise", "include", and "have", when used herein, specify the presence of stated features, integers, steps, operations, elements, components, or combinations thereof, but do not preclude the presence or addition of one or more other features, integers, steps, operations, elements, components, or combinations thereof.

Hereinafter, embodiments will be described in detail with reference to the accompanying drawings.

Figure 1:
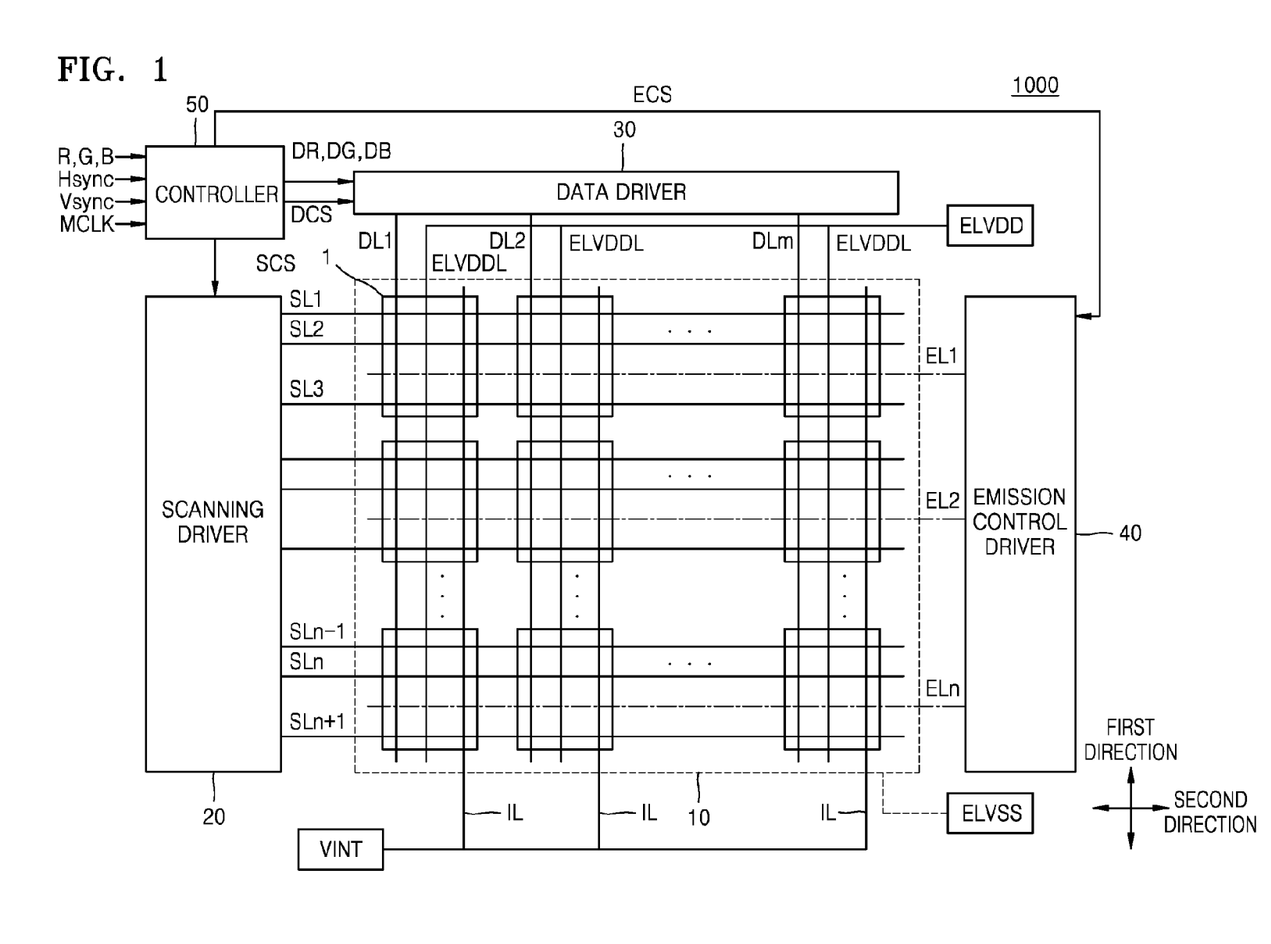
FIG. 1 is a schematic block diagram of an organic light-emitting display apparatus according to an embodiment.

FIG. 1 is a schematic block diagram of an organic light-emitting display apparatus 1000 according to an embodiment.

The organic light-emitting display apparatus 1000 according to an embodiment includes a display unit 10 including a plurality of pixels 1, a scan driving unit 20, a data driving unit 30, an emission control driving unit 40, and a control unit 50.

The display unit 10 includes the pixels 1 that are disposed at intersections between a plurality of scan lines SL1 to SLn+1, a plurality of data lines DL1 to DLm, and a plurality of emission control lines EL1 to ELn to be arranged in a matrix-like form. The scan lines SL1 to SLn+1 and the emission control lines EL1 to ELn extend in a second direction that is a row direction, and the data lines DL1 to DLm and a driving voltage line ELVDDL extend in a first direction that is a column direction. In a pixel line, the value n of the scan lines SL1 to SLn+1 may be different from the value n of the emission control lines EL1 to ELn.

Each of the pixels 1 is connected to three scan lines among the scan lines SL1 to SLn+1 connected to the display unit 10. The scan driving unit 20 generates and transfers three scan signals to each of the pixels 1 through the scan lines SL1 to SLn+1.

In embodiments, the scan driving unit 20 sequentially supplies scan signals to the first scan lines SL2 to SLn, the second scan lines SL1 to SLn−1, or the third scan lines SL3 to SLn+1.

An initialization voltage line IL may receive an initialization voltage VINT of the display unit 10 applied from an external power supply source.

Also, each of the pixels 1 is connected to one of the data lines DL1 to DLm connected to the display unit 10 and one of the emission control lines EL1 to ELn connected to the display unit 10.

The data driving unit 30 transfers a data signal to each of the pixels 1 through the data lines DL1 to DLm. Whenever a scan signal is supplied to the first scan lines SL2 to SLn, a data signal is supplied to the pixel 1 selected by the scan signal.

The emission control driving unit 40 generates and transfers an emission control signal to each of the pixels 1 through the emission control lines EL1 to ELn. The emission control signal controls an emission time of the pixel 1. The emission control driving unit 40 may be omitted according to the internal structure of the pixel 1.

The control unit 50 converts a plurality of image signals R, G, and B, which are received from outside, into a plurality of image data signals DR, DG, and DB and transfers the image data signals DR, DG, and DB to the data driving unit 30. Also, the control unit 50 receives a vertical synchronization signal Vsync, a horizontal synchronization signal Hsync, and a clock signal MCLK and generates control signals for controlling the operations of the scan driving unit 20, the data driving unit 30, and the emission control driving unit 40. In embodiments, the control unit 50 generates a scan driving control signal SCS for controlling the scan driving unit 20, a data driving control signal DCS for controlling the data driving unit 30, and an emission driving control signal ECS for controlling the emission control driving unit 40.

Each of the pixels 1 receives a first power voltage ELVDD and a second power voltage ELVSS that are applied from outside. The first power voltage ELVDD may be a predetermined high-level voltage, and the second power voltage ELVSS may be a ground voltage or a voltage that is lower than the first power voltage ELVDD. The first power voltage ELVDD is supplied to each of the pixels 1 through the driving voltage line ELVDDL.

Each of the pixels 1 emits a predetermined brightness of light by a driving current supplied to a light-emitting device according to a data signal received through the data lines DL1 to DLm.

Figure 2:
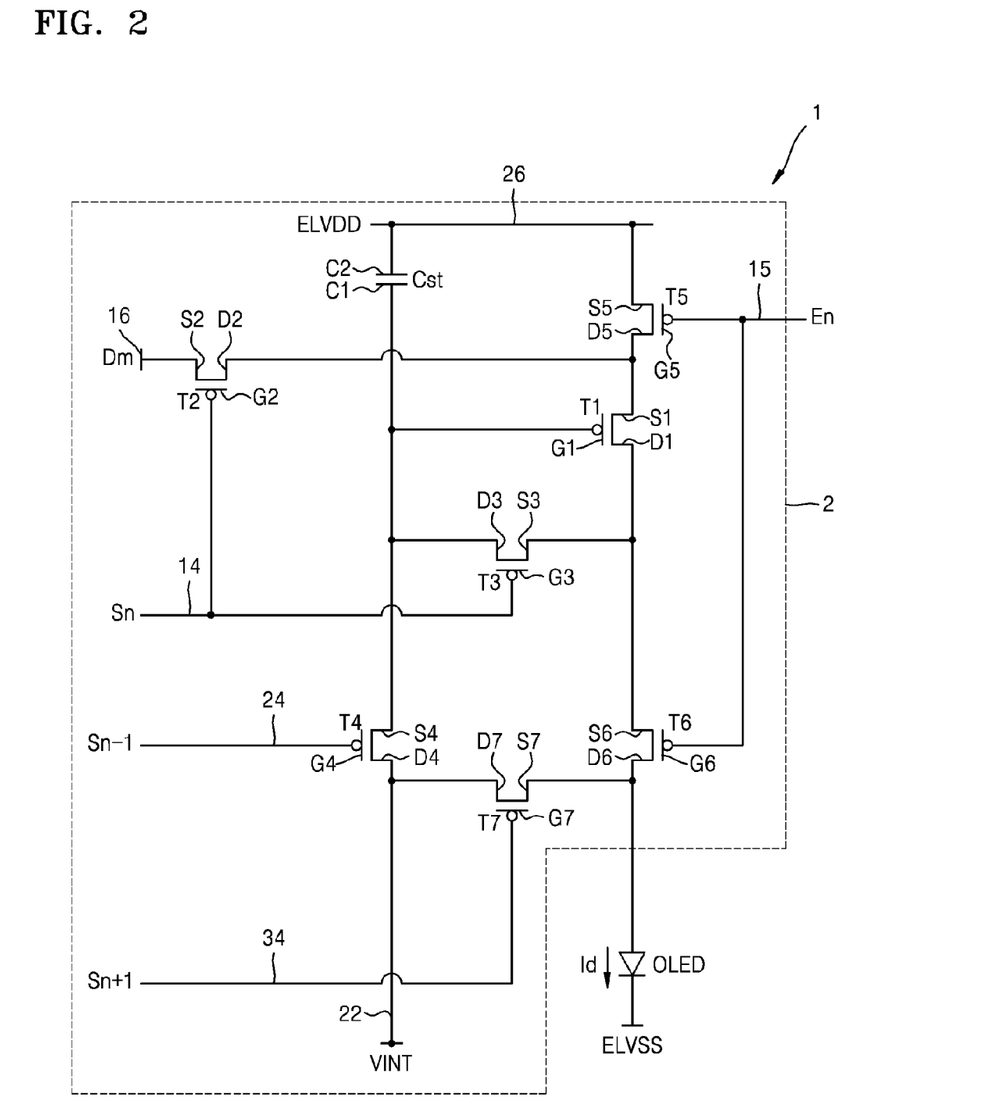
FIG. 2 is an equivalent circuit diagram of a pixel of an organic light-emitting display apparatus according to an embodiment.

FIG. 2 is an equivalent circuit diagram of a pixel 1 of an organic light-emitting display apparatus 1000 according to an embodiment.

The pixel 1 of the organic light-emitting display apparatus 1000 according to an embodiment includes a pixel circuit 2 including a plurality of thin film transistors (TFTs) T1 to T7 and at least one storage capacitor Cst. Also, the pixel 1 may include an organic light-emitting device OLED that emits light by receiving a driving current through the pixel circuit 2.

The TFTs T1 to T7 include a driving TFT T1, a data transfer TFT T2, a compensation TFT T3, a first initialization TFT T4, a first emission control TFT T5, a second emission control TFT T6, and a second initialization TFT T7.

The pixel 1 includes a first scan line 14 transferring a first scan signal Sn to the data transfer TFT T2 and the compensation TFT T3, a second scan line 24 transferring a second scan signal Sn-1 to the first initialization TFT T4, a third scan line 34 transferring a third scan signal Sn+1 to the second initialization TFT T7, an emission control line 15 transferring an emission control signal En to the first emission control TFT T5 and the second emission control TFT T6, a data line 16 transferring a data signal Dm, a driving voltage line 26 transferring a first power voltage ELVDD, and an initialization voltage line 22 transferring an initialization voltage VINT initializing the driving TFT T1.

A driving gate electrode G1 of the driving TFT T1 is connected to a first electrode C1 of the storage capacitor Cst. In detail, the driving gate electrode G1 is provided in a body in the same layer as the first electrode C1. A driving source electrode S1 of the driving TFT T1 is connected to the driving voltage line 26 via the first emission control TFT T5. A driving drain electrode D1 of the driving TFT T1 is electrically connected to a pixel (anode) electrode of the organic light-emitting device OLED via the second emission control TFT T6. According to a switching operation of the data transfer TFT T2, the driving TFT T1 receives the data signal Dm and supplies a driving current Id to the organic light-emitting device OLED.

A data transfer gate electrode G2 of the data transfer TFT T2 is connected to the first scan line 14. A data transfer source electrode S2 of the data transfer TFT T2 is connected to the data line 16. A data transfer drain electrode D2 of the data transfer TFT T2 is connected to the driving source electrode S1 of the driving TFT T1 and is connected to the driving voltage line 26 via the first emission control TFT T5. In a switching operation, the data transfer TFT T2 is turned on according to the first scan signal Sn received through the first scan line 14, to transmit the data signal Dm received through the data line 16 to the driving source electrode S1 of the driving TFT T1.

A compensation gate electrode G3 of the compensation TFT T3 is connected to the first scan line 14. A compensation source electrode S3 of the compensation TFT T3 is connected to the driving drain electrode D1 of the driving TFT T1 and is connected to the anode electrode of the organic light-emitting device OLED via the second emission control TFT T6. A compensation drain electrode D3 of the compensation TFT T3 is connected in common to the first electrode C1 of the storage capacitor Cst, a first initialization source electrode S4 of the first initialization TFT T4, and the driving gate electrode G1 of the driving TFT T1. The compensation TFT T3 is turned on according to the first scan line Sn received through the first scan line 14, to connect the driving gate electrode G1 and the driving drain electrode D1 of the driving TFT T1 to diode-connect the driving TFT T1.

A first initialization gate electrode G4 of the first initialization TFT T4 is connected to the second scan line 24. A first initialization drain electrode D4 of the first initialization TFT T4 is connected to the initialization voltage line 22. The first initialization source electrode S4 of the first initialization TFT T4 is connected in common to the first electrode C1 of the storage capacitor Cst, the compensation drain electrode D3 of the compensation TFT T3, and the driving gate electrode G1 of the driving TFT T1. In an initialization operation, the initialization TFT T4 is turned on according to the second scan line Sn-1 received through the second scan line 24, to transmit the initialization voltage VINT to the driving gate electrode G1 of the driving TFT T1 to initialize a voltage of the driving gate electrode G1 of the driving TFT T1.

A first emission control gate electrode G5 of the first emission control TFT T5 is connected to the emission control line 15. A first emission control source electrode S5 of the first emission control TFT T5 is connected to the driving control line 26. A first emission control drain electrode D5 of the first emission control TFT T5 is connected to the driving source electrode S1 of the driving TFT T1 and the data transfer drain electrode D2 of the data transfer TFT T2.

A second emission control gate electrode G6 of the second emission control TFT T6 is connected to the emission control line 15. A second emission control source electrode S6 of the second emission control TFT T6 is connected to the driving drain electrode D1 of the driving TFT T1 and the compensation source electrode S3 of the compensation TFT T3. A second emission control drain electrode D6 of the second emission control TFT T6 is electrically connected to the anode electrode of the organic light-emitting device OLED. According to the emission control signal En received through the emission control line 15, the first emission control TFT T5 and the second emission control TFT T6 are simultaneously turned on to transmit the first power voltage ELVDD to the organic light-emitting device OLED, so that the driving current Id flows through the organic light-emitting device OLED.

A second initialization gate electrode G7 of the second initialization TFT T7 is connected to the third scan line 34. A second initialization source electrode S7 of the second initialization TFT T7 is connected to the anode electrode of the organic light-emitting device OLED. A second initialization drain electrode D7 of the second initialization TFT T7 is connected to the initialization voltage line 22. According to the third scan signal Sn+1 received through the third scan line 34, the second initialization TFT T7 is turned on to initialize the anode electrode of the organic light-emitting device OLED.

A second electrode C2 of the storage capacitor Cst is disposed to overlap with the first electrode C1 at least partially. The second electrode C2 may be formed in the same layer as the driving voltage line 26. The first electrode C1 of the storage capacitor Cst is connected in common to the driving gate electrode G1 of the driving TFT T1, the compensation drain electrode D3 of the compensation TFT T3, and the first initialization source electrode S4 of the first initialization TFT T4.

A cathode electrode of the organic light-emitting device OLED is connected to a second power voltage ELVSS. The organic light-emitting device OLED receives the driving current Id from the driving TFT T1 and emits light, thereby displaying an image.

In embodiments, a thin film transistor (TFT) circuit panel comprises a substrate and first and second patterned multi-layer structures formed over the substrate. The first patterned multi-layer structure is to provide a driving TFT and a storage capacitor, and comprises: a semiconductor layer, a first electrode over the semiconductor layer, a second electrode disposed over the first electrode and insulated from the first electrode, a storage insulating layer disposed between the first electrode and the second electrode, and a driving gate insulating layer disposed between the semiconductor layer and the first electrode. The second patterned multi-layer structure is spaced from the first multi-layer structure, and comprises: a lower patterned insulating layer, a patterned conductive layer and a top patterned insulating layer. An organic insulating material is filled between the first and second patterned multi-layer structures. Additional embodiments are further discussed below.

Figure 3:
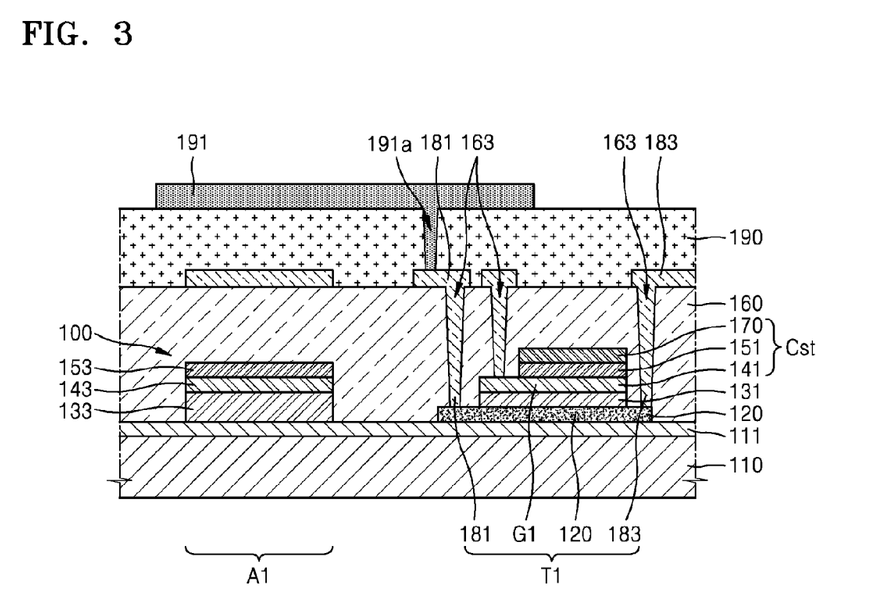
FIG. 3 is a schematic cross-sectional view of a pixel circuit of a thin film transistor (TFT) array panel included in an organic light-emitting display apparatus according to an embodiment.

FIG. 3 is a schematic cross-sectional view of a pixel circuit 2 of a TFT array panel included in an organic light-emitting display apparatus 1000 according to an embodiment.

The TFT array panel according to the present embodiment may include a driving TFT T1 disposed on or over a substrate 110. Also, as illustrated in FIG. 3, a buffer layer 111 may be formed before the driving TFT T1 is formed. The buffer layer 111 may function as a barrier layer and/or a blocking layer that prevents diffusion of impurity ions, prevents infiltration of outside air or moisture, and planarizes a surface. However, the buffer layer 111 may not be formed.

An active layer 120 of the driving TFT T1 may be formed on the buffer layer 111. The active layer 120 may include a channel region that is not doped with a dopant and is formed of polysilicon, and a source region and a drain region that are doped with a dopant and are formed on both sides of the channel region. Herein, the dopant depends on the type of the TFT, and may be an N-type dopant or a P-type dopant.

A driving gate insulating layer 131 may be formed on the active layer 120 to cover the active layer 120. An insulating material layer may be stacked on or over an entire surface of the substrate 110 in an initial process and may be patterned to form the driving gate insulating layer 131 by batch-patterning in a subsequent process. This will be described later in detail. The driving gate insulating layer 131 may include a single layer or multiple layers formed of an inorganic material such as silicon oxide or silicon nitride. The driving gate insulating layer 131 insulates the active layer 120 and a driving gate electrode G1 disposed thereon.

The driving gate electrode G1 may include at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), titanium (Ti), tungsten (W), and copper (Cu).

As illustrated in FIG. 3, a storage capacitor Cst including a first electrode 141 integrated with the driving gate electrode G1 of the driving TFT T1 into a single body, a storage insulating layer 151, and a second electrode 170 may be disposed on the driving gate insulating layer 131. In embodiments, the driving gate electrode G1 and the first electrode 141 may be provided in a single body, which can function as both the driving gate electrode and the first electrode.

According to an embodiment, the storage capacitor Cst may be disposed to overlap with the driving TFT T1. In detail, since the driving gate electrode G1 and the first electrode 141 are formed in a single body, the storage capacitor Cst and the driving TFT T1 may be disposed to overlap each other when viewed in a direction of the thickness of the substrate 110. Since the storage capacitor Cst and the driving TFT T1 are disposed to overlap each other, a sufficient area for the first electrode 141 and the second electrode 170 may be secured. Accordingly, the sufficient storage capacity of the storage capacity Cst may be secured.

The second electrode 170 may be disposed over the first electrode 141 and may be disposed to overlap with the first electrode 141 at least partially.

Also, the storage insulating layer 151 may be disposed between the first electrode 141 and the second electrode 170 to insulate the first electrode 141 and the second electrode 170.

A patterned insulating layer 133 may be formed in the same layer as the driving gate insulating layer 131. The patterned insulating layer 133 may be formed on or over the substrate 110 simultaneously with the formation of the driving gate insulating layer 131. The patterned insulating layer 133 may be formed to remain only in a line region A1 by a batch-patterning process. This will be described later in detail.

In embodiments, as illustrated in FIG. 3, the patterned insulating layer 133 may be formed in the same layer as the driving gate insulating layer 131.

A patterned electrode 143 and a first line may be disposed in the same layer as the driving gate electrode G1. The first line may be a line, such as a first scan line 14, a second scan line 24, a third scan line 34, an initialization voltage line 22, or a mesh driving voltage line 26', that is disposed in the same layer as the driving gate electrode G1.

A top layer 153 may be a patterned insulating layer formed on the patterned electrode 143 in the same layer as the storage insulating layer 151. The storage insulating layer 151 is disposed between the first electrode 141 and the second electrode 170 to insulate the electrode. However, the top layer 153 may be stacked and formed simultaneously with the formation of the storage insulating layer 151.

In the TFT array panel according to the present embodiment, a patterned multilayer structure 100 may be formed in a line region as illustrated in FIG. 3. In embodiments, the patterned multilayer structure 100 may be a multi-layer structure disposed in the line region A1 that is illustrated to be located on the left side of the substrate 110 in FIG. 3.

The patterned multilayer structure 100 may be a structure that is formed by a stack of the patterned insulating layer 133, the patterned electrode 143, and the top layer 153. As illustrated in FIG. 3, the patterned insulating layer 133, the patterned electrode 143, and the top layer 153 may be formed to have the same horizontal length in a section of the array panel as illustrated in FIG. 3.

As described above, the patterned insulating layer 133 may be formed simultaneously with the formation of the driving gate insulating layer 131, and the patterned electrode 143 may be formed simultaneously with the formation of the driving gate electrode G1 and the first electrode 141. Also, the top layer 153 may be stacked and formed simultaneously with the formation of the storage insulating layer 151.

Thus, the patterned insulating layer 133 and the driving gate insulating layer 131 may be formed in the same layer, the patterned electrode 143 and the first electrode 141 may be formed in the same layer, and the top layer 153 and the storage insulating layer 151 may be formed in the same layer.

In manufacturing the panel 100, after a plurality of layers are stacked and formed, the plurality of layers may be patterned by a batch-patterning process to leave and form only the patterned multilayer structure 100 in the line region A1.

The batch-patterning process for leaving and forming only the patterned multilayer structure 100 in the line region A1 will be described later in detail.

Since the respective layers are patterned and removed to leave and form only the patterned multilayer structure 100 in the line region A1, the insulating materials for forming patterned insulating layer 133 and the top layer 153 may not exist between other lines and the driving TFT T1.

In embodiments, since the plurality of layers stacked and formed over the substrate 110 are batch-patterned, the materials of the plurality of layers for forming the patterned insulating layer 133, the patterned electrode 143, and the top layer 153 may all be removed except the patterned multilayer structure 100 having the same horizontal length.

Thus, since such materials do not exist between the lines, the possibility of a coupling effect exerting an influence between the lines is reduced. The coupling effect exerting an influence between the lines to generate a crosstalk will be described later in detail.

The TFT array panel according to the present embodiment may further include an interlayer insulating layer 160 that is disposed on or over the patterned multilayer structure 100 and the second electrode 170 that is located at the top of the storage capacitor Cst.

As illustrated in FIG. 3, the interlayer insulating layer 160 may be formed on or over the patterned multilayer structure 100 and the storage capacitor Cst and may also be formed to completely cover the patterned multilayer structure 100 and the storage capacitor Cst.

In embodiments, as illustrated in FIG. 3, instead of being divided into layers, the interlayer insulating layer 160 may be united into one single layer and may be formed of an organic material. For example, the interlayer insulating layer 160 may be formed of at least one selected from polyacrylates resin, epoxy resin, phenolic resin, polyamides resin, polyimides rein, unsaturated polyesters resin, poly phenylenethers resin, poly phenylenesulfides resin, and benzocyclobutene (BCB). Of course, embodiments are not limited thereto, and the interlayer insulating layer 160 may be formed of any organic material.

Also, the interlayer insulating layer 160 may be disposed on or over the substrate 110 to fill a space between the substrate 110 and a layer in which a source electrode 181 and a drain electrode 183 of the driving TFT T1 are formed.

In embodiments, all space except a region, in which the patterned multilayer structure 100 and the driving TFT T1 are formed, may be formed of the interlayer insulating layer 160 formed of an organic material.

In the TFT array panel according to the present embodiment, as illustrated in FIG. 3, not only a space on the patterned multilayer structure 100 but also a space between the patterned multilayer structure 100 and the driving TFT T1 may be formed of the interlayer insulating layer 160 formed of an organic material.

This is because the patterned insulating layer 133, the patterned electrode 143, and the top layer 153 are batch-patterned to have the same horizontal length as described above. Since all regions except the patterned multilayer structure 100 is patterned and removed, the space between the patterned multilayer structure 100 and the driving TFT T1 may also be filled with the interlayer insulating layer 160.

In the TFT array panel according to the present embodiment, the driving gate insulating layer 131 and the patterned insulating layer 133 may be formed of an inorganic material. In this case, an empty space may be formed between the driving gate insulating layer 131 and the patterned insulating layer 133 by a batch-patterning process, and the interlayer insulating layer 160 formed of an organic material may be formed therein.

Also, in the TFT array panel according to another embodiment, the storage insulating layer 151 and the top layer 153 may be formed of an inorganic material. In this case, an empty space may be formed between the storage insulating layer 151 and the top layer 153 by a batch-patterning process, and the interlayer insulating layer 160 formed of an organic material may be formed therein.

The TFT array panel according to the present embodiment is distinctly different from a typical TFT circuit structure. In a typical structure, insulation layers may be placed above and below an electrically conductive layer portion which can be used as, for example, an electrode or an electrically conductive line, however, the insulation layers are not patterned concurrently with patterning of the electrically conductive layer portion. Further, such insulating layers are continuously extending over and stacked above and below another electrically conductive layer, for example, an electrode of a capacitor structure.

In the TFT array panel according to the present embodiment, as illustrated in FIG. 3, the space between the patterned multilayer structure 100 and the driving TFT T1 may also be filled with the interlayer insulating layer 160 formed of an organic material. The TFT array panel according to the present embodiment is different in terms of structures and materials from a typical TFT structure.

In the typical TFT circuit structure, since batch-patterning is not performed, a patterned multi-layer structure is not formed. On the other hand, in the TFT array panel according to the present embodiment, the patterned multilayer structure 100 is formed by batch-patterning, and the space between the patterned multilayer structure 100 and the driving TFT T1 may be filled with the interlayer insulating layer 160.

In the typical TFT circuit structure, insulation layers which may be compared with the storage insulating layer 151 and the top layer 153 of the illustrated embodiment may be formed of an inorganic material, and insulation layers corresponding to the driving gate insulating layer 131 and the patterned insulating layer 133 formed between the lines may also be formed of an inorganic material. In the typical structure, layers formed of an inorganic material exist between the lines.

On the other hand, in the TFT array panel according to the present embodiment, since the patterned multilayer structure 100 is formed, the interlayer insulating layer 160 of an organic material may be formed between the lines as described above.

Thus, in the TFT array panel according to the present embodiment, since only the interlayer insulating layer 160 formed of an organic material may exist between the lines, a crosstalk may be reduced.

A crosstalk may be generated by a coupling effect exerting an influence between the lines, which may cause spots or blurs in a display apparatus. A coupling effect increases as a dielectric constant increases. Since an organic material has a lower dielectric constant than an inorganic material, the possibility of a coupling effect is reduced.

Thus, in the case of the TFT array panel in which only an organic material exists between the lines according to the present embodiment, the possibility of a coupling effect may be reduced and thus a crosstalk may be reduced.

The TFT array panel according to the present embodiment may further include switching TFTs T2 to T7 (not illustrated) on or over the substrate 110.

In embodiments, the panel 1000 further includes switching TFTs for each of an array of pixels of a display device, for example, an organic light-emitting display device. In this case, since the patterned multilayer structure 100 is formed by a batch-patterning process, the interlayer insulating layer 160 may also be formed between the active layer 120 of the driving TFT T1 and an active layer 120 of the switching TFTs T2 to T7.

Also, all of the space between the lines of the switching TFTs T2 to T7 and the driving TFT T1 may also be formed of the interlayer insulating layer 160 formed of an organic material.

Thus, since all of the space between the lines and the active layers of the TFTs T1 to T7 is formed of the interlayer insulating layer 160 formed of an organic material, the possibility of a coupling effect may be reduced and thus a crosstalk may be reduced.

Also, in the TFT array panel according to the present embodiment, since all regions except the patterned multilayer structure 100 between the substrate 110 and a layer including the source electrode 181 and the drain electrode 183 is filled with the interlayer insulating layer 160 formed of an organic material, an RC delay may be reduced.

The RC delay is a time taken to transfer a signal. Thus, the efficiency of a display apparatus decreases as the RC delay increases. The RC delay is influenced by a dielectric constant and a distance between the lines or the electrodes. The RC delay decreases as the distance between the lines or the electrodes increases or the dielectric constant decreases.

In the TFT array panel according to the present embodiment, since the patterned multilayer structure 100 may be formed by batch-patterning and the interlayer insulating layer 160 formed of an organic material may be formed in all regions formed by the batch-patterning, the RC delay may be reduced. This is because an organic material has a lower dielectric constant than an inorganic material.

This is also because the thickness of the interlayer insulating layer 160 increases since the interlayer insulating layer 160 is formed not only on or over the substrate 110 but also in the layer in which the source electrode 181 and the drain electrode 183 are formed.

In the TFT array panel according to the present embodiment, since the patterned multilayer structure 100 is formed by batch-patterning and the remaining space is filled with the interlayer insulating layer 160 formed of an organic material, a crosstalk may be reduced and an RC delay may be reduced.

In the TFT array panel according to the present embodiment, a contact hole 163 may be formed in the interlayer insulating layer 160. The contact hole 163 may be formed by a mask-based patterning process and etching process. The etching process may be performed by wet etching, dry etching, or a combination thereof.

As illustrated in FIG. 3, the source electrode 181 and the drain electrode 183 of the driving TFT T1 are formed on the interlayer insulating layer 160. In this case, the source electrode 181 and the drain electrode 183 may be formed to be connected to a source region and a drain region of the active layer 120 through the contact hole 163.

The TFT array panel according to the present embodiment may further include a via layer 190 that covers the storage capacitor Cst, the source electrode 181, and the drain electrode 183. Also, a via hole may be further formed to expose the source electrode 181 or the drain electrode 183. Also, a pixel electrode 191 connected to the source electrode 181 or the drain electrode 183 through the via hole may be further formed on the via layer 190.

Figure 4:
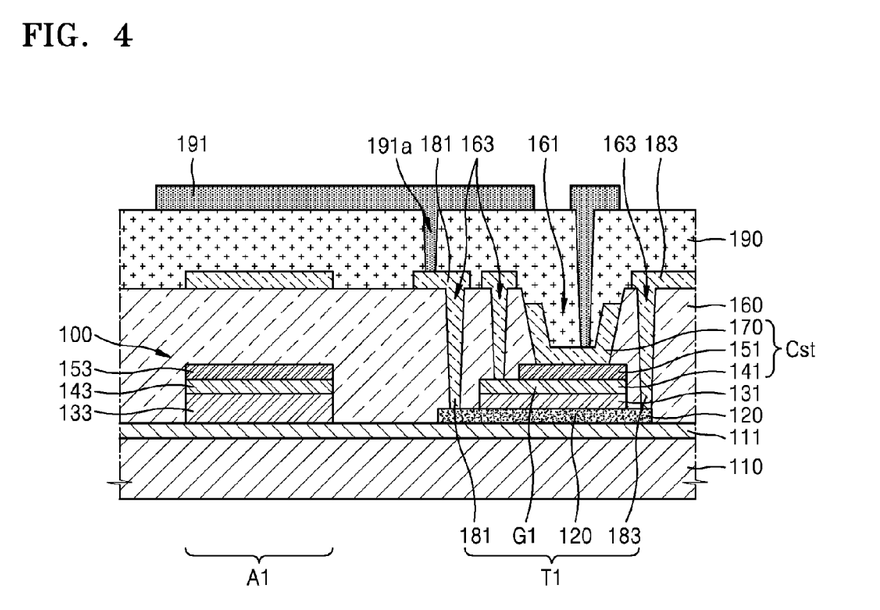
FIG. 4 is a cross-sectional view of a TFT array panel according to another embodiment.

FIG. 4 is a cross-sectional view of a TFT array panel according to another embodiment. Since some of the elements of the TFT array panel according to the present embodiment are the same as those in the above-described embodiment, redundant descriptions thereof will be omitted and differences therebetween will be mainly described.

As illustrated in FIG. 4, in the TFT array panel according to the present embodiment, an hole 161 may be further formed in an interlayer insulating layer 160 to expose a portion of a storage insulating layer 151. Also, a second electrode 170 of a storage capacitor Cst may be disposed in the hole 161.

Since the second electrode 170 is disposed to overlap with a first electrode 141, the hole 161 may be formed in a region overlapping with the first electrode 141. The second electrode 170 may be disposed in the hole 161 and may be formed to contact a top surface of the storage insulating layer 151.

Also, the second electrode 170 may be formed to extend along the sidewall of the hole 161 to a top surface of the interlayer insulating layer 160. However, embodiments are not limited thereto, and the second electrode 170 may be formed only in the hole 161 as illustrated in FIG. 4.

In the TFT array panel according to the present embodiment, the second electrode C2 of the storage capacitor Cst may be patterned and formed simultaneously with the formation of the source electrodes 51 and S6 and the drain electrodes D1 and D6. Thus, since a mask process for forming the second electrode C2 of the storage capacitor Cst is not necessary, the number of mask processes may be reduced.

FIGS. 5A to 5E are sequential cross-sectional views illustrating a TFT array panel manufacturing method according to embodiments. A process of manufacturing the TFT array panel illustrated in FIG. 4 will be described as an example.

Figure 5A:
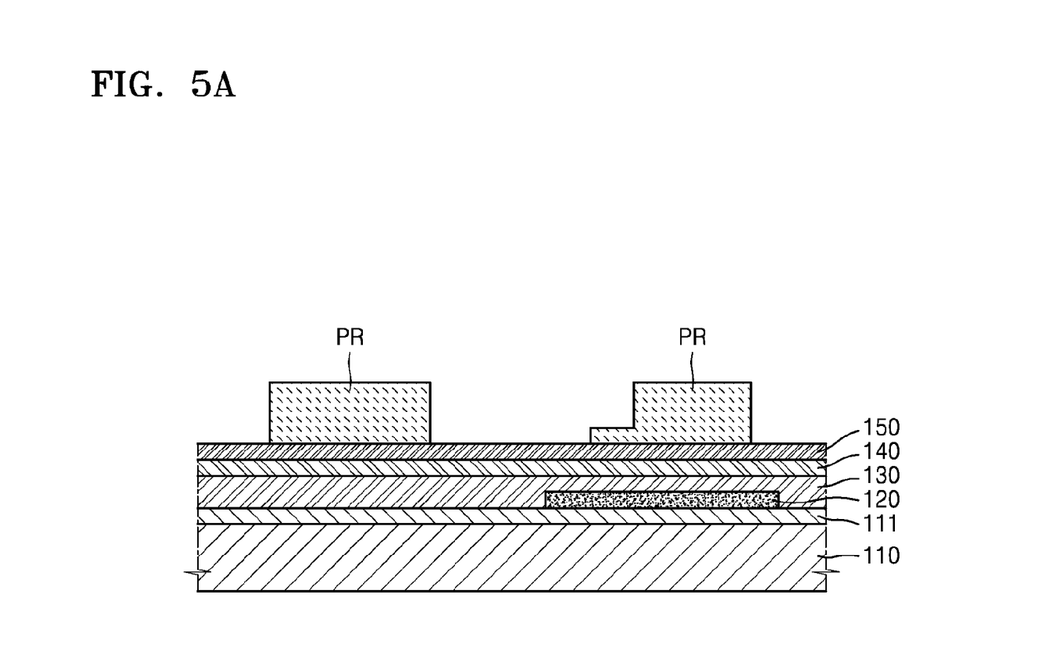
FIGS. 5A to 5E are sequential cross-sectional views illustrating a TFT array panel manufacturing method according to embodiments.

Referring to FIG. 5A, a buffer layer 111 is stacked on a substrate 110, and an active layer 120 is formed on the buffer layer 111. A gate insulating layer 130 is formed on the active layer 120.

The active layer 120 may be formed of a semiconductor including amorphous silicon or crystalline silicon, and may be deposited by various deposition processes. In this case, the crystalline silicon may be formed by crystallizing the amorphous silicon. The amorphous silicon may be crystallized by various processes, such as rapid thermal annealing (RTA), solid phase crystallization (SPC), excimer laser annealing (ELA), metal induced crystallization (MIC), metal induced lateral crystallization (MILC), and sequential lateral solidification (SLS). The active layer 120 may be patterned by a photolithography process.

The gate insulating layer 130 insulates the active layer 120 and a driving gate electrode G1 to be formed thereon. In embodiments, in the manufacturing process of the panel 100, a first insulating layer 130 is first formed on or over an entire surface of the substrate 110 to cover the active layer 120. The first insulating layer 130 may be formed of an inorganic insulator material. For example, the first insulating layer 130 may be formed by various deposition processes, such as sputtering, chemical vapor deposition (CVD), and plasma enhanced chemical vapor deposition (PECVD).

Thereafter, an electrically conductive material layer is formed on the first insulating layer 130 to cover the active layer 120. In embodiments, during the process of making the panel 100, the electrically conductive material layer 140 may be formed over an entire surface of the first insulating layer 130 as illustrated in FIG. 5A.

The electrically conductive layer 140 may include at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), titanium (Ti), tungsten (W), and copper (Cu).

Also, a second insulating layer 150 may be stacked and formed on the electrically conductive material layer 140.

Figure 5B:
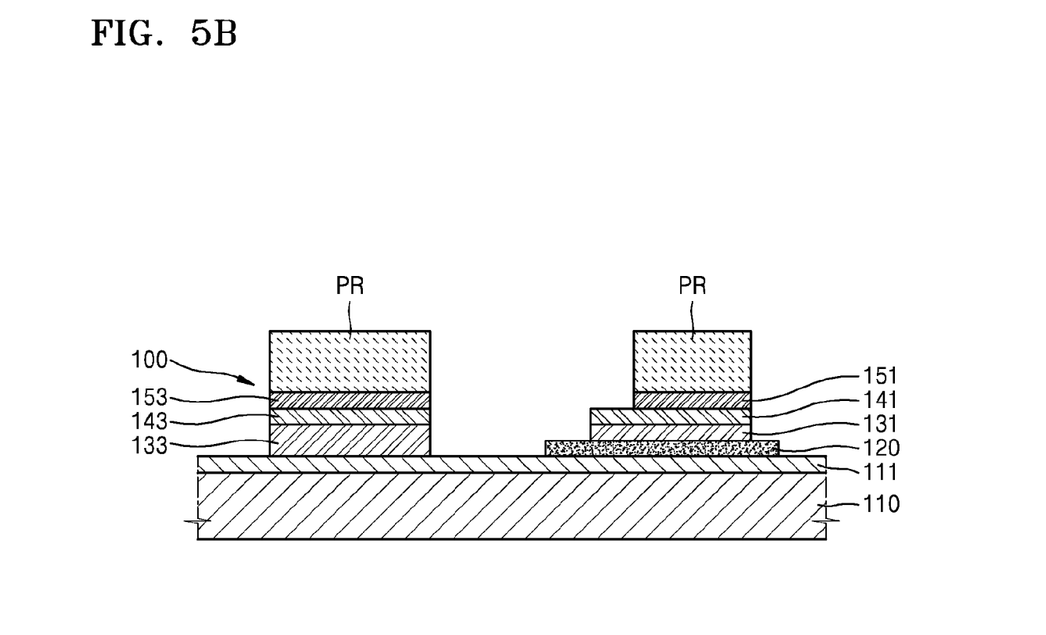

Referring to FIG. 5B, the first insulating layer 130, the electrically conductive material layer 140, and the second insulating layer 150 may be patterned by a photolithography process.

Since the first insulating layer 130, the electrically conductive material layer 140, and the second insulating layer 150 are batch-patterned, a patterned multilayer structure 100 may be formed in a line region A1 and another patterned multilayer structure may be formed to provide the TFT T1 and the capacitor Cst. The patterned multilayer structure 100 may be formed in the shape of a stack structure of a patterned insulating layer 133, a patterned electrode 143, and a top layer 153 that have the same horizontal length.

Since a batch-patterning process is performed, an empty space may be formed on or over the substrate 110 between the patterned multilayer structure 100 and a region in which a storage capacitor is formed, as illustrated in FIG. 5B.

Figure 5C:
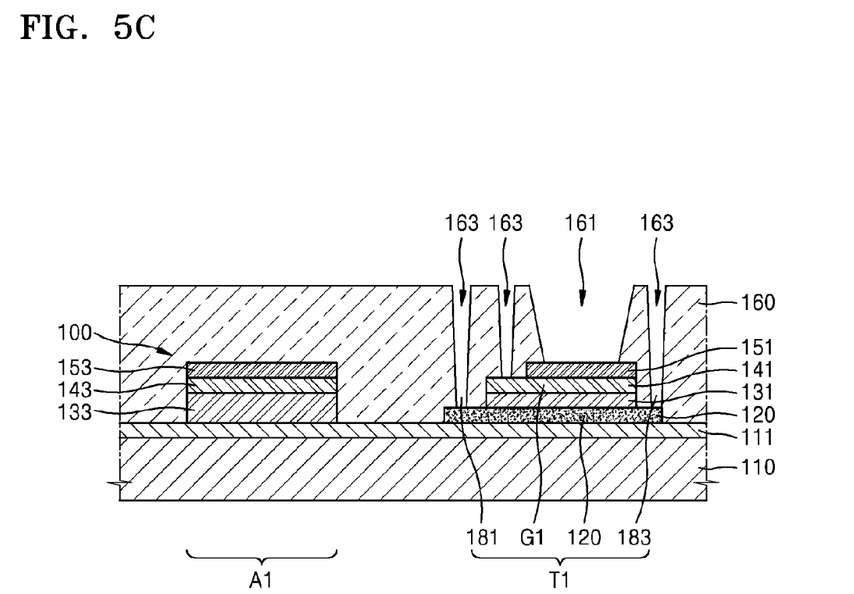

Referring to FIG. 5C, an interlayer insulating layer 160 may be formed on or over the entire surface of the substrate 110 to cover the patterned multilayer structure 100 and the driving gate electrode G1. In embodiments, the interlayer insulating layer 160 may be formed to fill the empty space on the substrate 110. The interlayer insulating layer 160 may be formed of an organic material.

Thereafter, a hole 161 and a contact hole 163 may be formed in the interlayer insulating layer 160. The hole 161 and the contact hole 163 may be formed by a mask-based patterning process and etching process. The etching process may be performed by wet etching, dry etching, or a combination thereof.

Figure 5D:
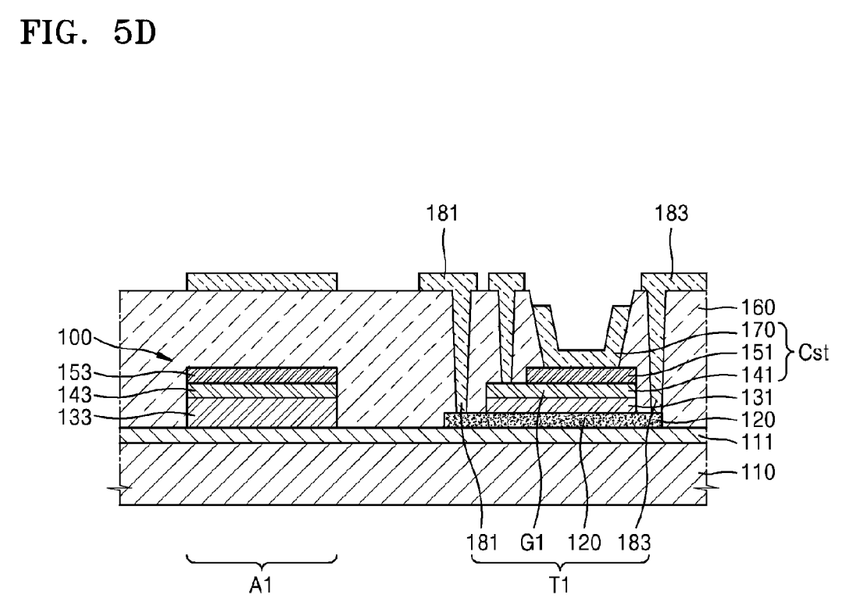

Referring to FIG. 5D, a source electrode 181 and a drain electrode 183 of a driving TFT T1 are formed on the interlayer insulating layer 160. In this case, the source electrode 181 and the drain electrode 183 are formed to be connected to a source region and a drain region of the active layer 120 through the contact hole 163.

At the same time, a second electrode 170 of a storage capacitor Cst may be formed in the hole 161 of the interlayer insulating layer 160.

In embodiments, the source electrode 181 and the drain electrode 183 of the driving TFT T1 and the second electrode 170 of the storage capacitor Cst may be simultaneously formed.

Figure 5E:
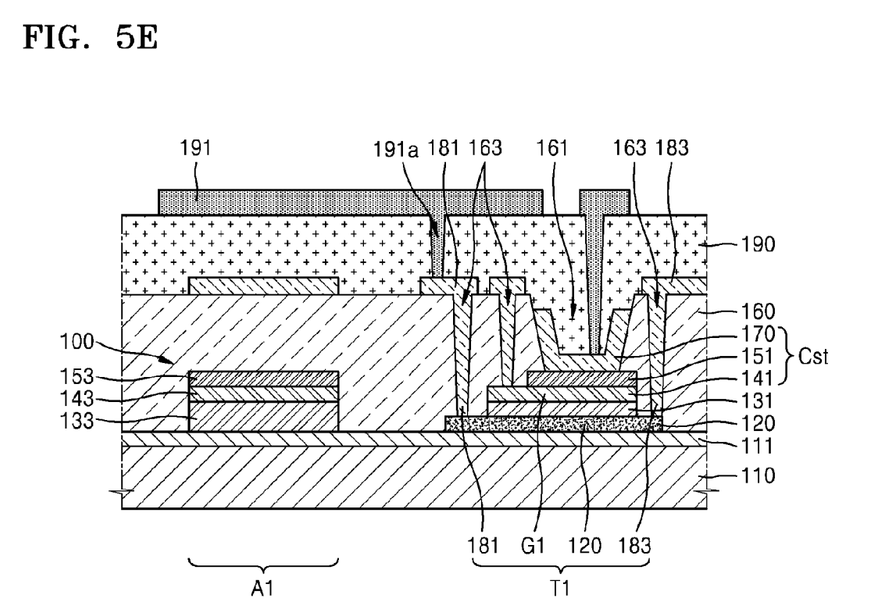

Referring to FIG. 5E, a via layer 190 may be formed to cover the source electrode 181, the drain electrode 183, and the storage capacitor Cst. Also, a via hole 191a may be formed to expose the source electrode 181 or the drain electrode 183.

Thereafter, a pixel electrode 191 may be formed to be connected to the source electrode 181 or the drain electrode 183 through the via hole 191a.

Figure 6:
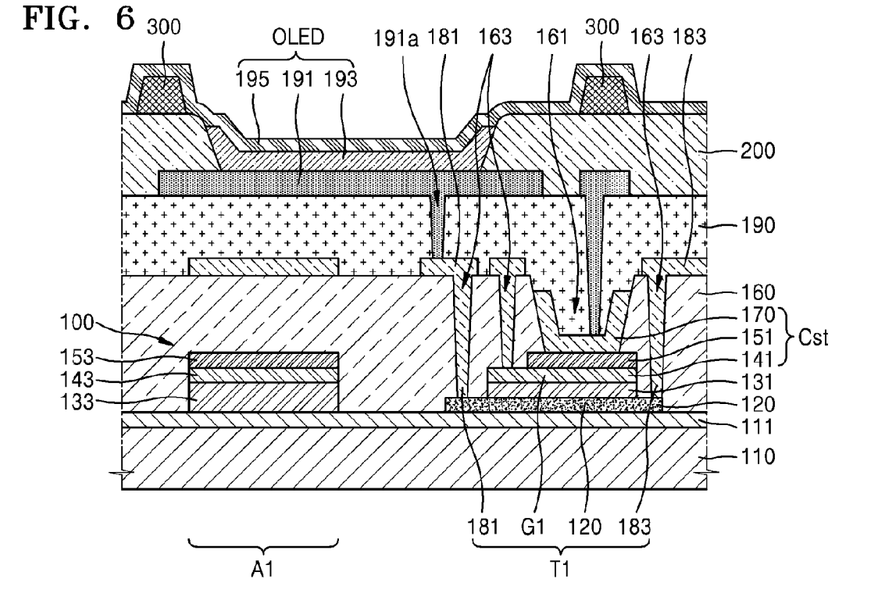
FIG. 6 is a schematic cross-sectional view of an organic light-emitting display apparatus according to an embodiment.

FIG. 6 is a schematic cross-sectional view of an organic light-emitting display apparatus according to an embodiment.

Referring to FIG. 6, the organic light-emitting display apparatus includes a TFT array panel according to an embodiment. In FIG. 6, like reference numerals as in FIG. 4 denote like elements. Thus, for brevity, redundant descriptions thereof will be omitted herein for simplicity of description.

In the organic light-emitting display apparatus, an organic light-emitting device OLED is disposed on the TFT array panel. The organic light-emitting device OLED includes a pixel electrode 191, an intermediate layer 193 including an organic emission layer, and an opposite electrode 195. Also, the organic light-emitting display apparatus may further include a pixel definition layer 200 and a spacer 300.

The pixel definition layer 200 may function to define a pixel region and a non-pixel region. The pixel definition layer 200 may include a hole that exposes the pixel electrode 191, and may be formed to cover the entire surface of the TFT array panel.

The pixel electrode 191, the intermediate layer 193, and the opposite electrode 195 constitute the organic light-emitting device OLED. Holes and electrons injected from the pixel electrode 191 and the opposite electrode 195 of the organic light-emitting device OLED may be combined in the organic emission layer of the intermediate layer 193 to generate light.

Although only one organic light-emitting device OLED is illustrated in the drawings, a display panel may include a plurality of organic light-emitting devices OLED. A single pixel may be formed in each organic light-emitting device OLED, and a red color, a green color, a blue color, or a white color may be implemented at each pixel.

As described above, according to the one or more of the above embodiments, a cross talk may be reduced and an RC delay may be reduced.

It should be understood that the embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope of the inventive concept as defined by the following claims.

What is claimed is:

1. A thin film transistor (TFT) circuit panel device comprising:
   a substrate comprising a major surface;
   a first multi-layer structure disposed over the substrate for providing a driving TFT and a storage capacitor, the first multi-layer structure comprising:
   a semiconductor layer,
   a first electrode over the semiconductor layer,
   a second electrode disposed over the first electrode and insulated from the first electrode,
   a storage insulating layer disposed between the first electrode and the second electrode, and
   a driving gate insulating layer disposed between the semiconductor layer and the first electrode to insulate the first electrode from the semiconductor layer, wherein the semiconductor layer, the driving gate insulating layer and the first electrode provide the driving TFT, wherein the first electrode, the storage insulating layer and the second electrode provide the storage capacitor; and
   a second multi-layer structure disposed over the substrate and spaced from the first multi- layer structure when viewed in a viewing direction perpendicular to the major surface, the second multi-layer structure comprising:
   a lower patterned insulating layer disposed over the substrate and formed of a same material as the driving gate insulating layer;
   a patterned conductive layer disposed over the lower patterned insulating layer and formed of a same material as the first electrode; and
   a top patterned insulating layer disposed over the patterned conductive layer and formed of a same material as the storage insulating layer,
   wherein the lower patterned insulating layer, the patterned conductive layer, and the top patterned insulating layer have a same width.

2. The device of claim 1, further comprising an interlayer insulating layer covering the first and second multi-layer structures, wherein the interlayer insulating layer is formed of an organic material.

3. The device of claim 2, wherein the interlayer insulating layer is formed over an entire major surface of the substrate, and comprises a portion disposed between the first electrode and the patterned conductive layer in the section.

4. The device of claim 1, wherein the storage insulating layer and the top patterned insulation layer are formed of an inorganic material.

5. The device of claim 2, wherein the interlayer insulating layer defines a hole that exposes a portion of the storage insulating layer.

6. The device of claim 5, wherein the second electrode is disposed in the hole.

7. The device of claim 1, wherein the driving gate insulating layer and the lower patterned insulating layer are formed of an inorganic material.

8. The device of claim 1, wherein the lower patterned insulating layer, the patterned conductive layer, and the top patterned insulating layer fully overlap each other in a depth dimension of the TFT circuit panel device.

9. A thin film transistor (TFT) circuit panel device comprising:
   a substrate comprising a major surface;
   a driving TFT disposed over the substrate;
   a storage capacitor comprising a first electrode integrated with a driving gate electrode of the driving TFT into a single electrode, a second electrode disposed over the first electrode and insulated from the first electrode, and a storage insulating layer formed between the first electrode and the second electrode;
   a driving gate insulating layer disposed between the substrate and the driving gate electrode;
   a lower patterned insulating layer disposed over the substrate and formed of a same material as the driving gate insulating layer;
   a patterned electrode disposed over the lower patterned insulating layer and formed of a same material as the driving gate electrode;
   a top patterned insulating layer disposed over the patterned electrode and formed of a same material as the storage insulating layer; and
   an interlayer insulating layer formed to cover the storage capacitor and the top patterned insulating layer,
   wherein the lower patterned insulating layer, the patterned electrode, and the top patterned insulating layer have a same width, and
   wherein the interlayer insulating layer is formed of an organic material.

10. The device of claim 9, wherein the interlayer insulating layer is formed over an entire major surface of the substrate to fill a space between the substrate and a layer in which a source electrode and a drain electrode of the driving TFT are formed.

11. The device of claim 9, wherein the storage insulating layer and the top patterned insulating layer are formed of an inorganic material.

12. The device of claim 11, wherein the interlayer insulating layer comprises a portion located between the storage insulating layer and the top patterned insulating layer.

13. The device of claim 9, wherein the driving gate insulating layer and the lower patterned insulating layer are formed of an inorganic material.

14. The device of claim 13, wherein the interlayer insulating layer comprises a portion located between the driving gate insulating layer and the lower patterned insulating layer.

15. The device of claim 9, wherein the driving TFT and the storage capacitor are disposed to overlap each other at least partially when viewed in the viewing direction.

16. An organic light-emitting display apparatus comprising:
   a substrate comprising a major surface; and
   a plurality of pixels disposed over the substrate,
   each of the plurality of pixels comprising:
   a driving thin film transistor (TFT) disposed over the substrate;
   a storage capacitor comprising a first electrode integrated with a driving gate electrode of the driving TFT into a single electrode, a second electrode disposed over the first electrode and insulated from the first electrode, and a storage insulating layer formed between the first electrode and the second electrode;

a driving gate insulating layer disposed between the substrate and the driving gate electrode;

a lower patterned insulating layer disposed over the substrate and formed of a same material as the driving gate insulating layer;

a patterned electrode disposed over the lower patterned insulating layer and formed of a same material as the driving gate electrode; and a top patterned insulating layer disposed over the patterned electrode and formed of a same material as the storage insulating layer, wherein the lower patterned insulating layer, the patterned electrode, and the top patterned insulating layer have a same width.

17. The organic light-emitting display apparatus of claim 16, further comprising an interlayer insulating layer covering the patterned multi-layer structure and the storage capacitor, wherein the interlayer insulating layer is formed of an organic material.

18. The organic light-emitting display apparatus of claim 17, wherein the interlayer insulating layer is formed over an entire major surface of the substrate to fill a space between the substrate and a layer in which a source electrode and a drain electrode of the driving TFT are formed.

19. An organic light-emitting display apparatus comprising:

the TFT circuit panel device of claim 1; and an array of organic light-emitting elements disposed over the TFT circuit panel device, wherein the TFT circuit panel device comprises a plurality of additional first multi-layer structures, wherein the first multi-layer structure and the plurality of additional first multi-layer structures in combination provides an array of TFT circuits, each of which is connected to one of the organic light-emitting elements.

* * * * *